United States Patent
Küsters et al.

(10) Patent No.: US 7,250,651 B2
(45) Date of Patent: Jul. 31, 2007

(54) SEMICONDUCTOR MEMORY DEVICE COMPRISING MEMORY CELLS WITH FLOATING GATE ELECTRODE AND METHOD OF PRODUCTION

(75) Inventors: Karl-Heinz Küsters, Boxdorf (DE); Josef Willer, Riemerling (DE); Corvin Liaw, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/921,766

(22) Filed: Aug. 19, 2004

(65) Prior Publication Data

US 2006/0038220 A1   Feb. 23, 2006

(51) Int. Cl.
*H01L 27/108* (2006.01)
*H01L 29/76* (2006.01)
*H01L 29/94* (2006.01)
*H01L 31/119* (2006.01)
*H01L 31/062* (2006.01)

(52) U.S. Cl. ............... 257/315; 257/301; 257/330; 257/317

(58) Field of Classification Search ............. 257/315, 257/301–302; 438/700
See application file for complete search history.

(56) References Cited

U.S. PATENT DOCUMENTS 5,796,166 A * 8/1998 Agnello et al. ............. 257/751
5,889,304 A    3/1999 Watanabe et al.
6,410,387 B1 * 6/2002 Cappelletti et al. ......... 438/257
6,518,618 B1    2/2003 Fazio et al.
6,559,008 B2 * 5/2003 Rabkin et al. ............... 438/257
2002/0149050 A1 10/2002 Fazio et al.

FOREIGN PATENT DOCUMENTS

JP       08088285 A    4/1996
WO   WO 01/41199 A    6/2001

OTHER PUBLICATIONS

Ichige, M., et al., "A novel self-aligned shallow trench isolation cell for 90nm 4Gbit NAND Flash EEPROMs," 2003 Symposium on VLSI Technology Digest of Technical Papers, Jun. 2003.
Him, Y.S., et al., "70nm NAND Flash Technology with $0.025 \mu m^2$ Cell Size for 4Gb Flash Memory," 2003 IEEE, Mar. 2003.
Kim D.C., et al., "A 2Gb NAND Flash Memory with $0.044 \mu m^2$ Cell Size using 90nm Flash Technology," 2002 IEEE.
Lee, J.D., et al., "Data Retnetion Characteristics of Sub-100 mm NAND Flash Memory Cells," IEEE Electron Device Letters, vol. 24, No. 12, Dec. 2003, pp. 748-750.

* cited by examiner

*Primary Examiner*—Chuong Anh Luu
(74) *Attorney, Agent, or Firm*—Slater & Matsil, L.L.P.

(57) ABSTRACT

Transistor bodies of semiconductor material located at a main surface of a semiconductor substrate between shallow trench isolations are provided with a rounded or curved upper surface. A floating gate electrode is arranged above said upper surface and electrically insulated from the semiconductor material by a tunnel dielectric having essentially the same tiny thickness throughout a primary tunnel area encompassing the area of curvature. The floating gate electrode may bridge the transistor body and is covered with a coupling dielectric provided for a control gate electrode, which forms part of a wordline.

24 Claims, 9 Drawing Sheets

SEMICONDUCTOR MEMORY DEVICE COMPRISING MEMORY CELLS WITH FLOATING GATE ELECTRODE AND METHOD OF PRODUCTION

TECHNICAL FIELD

The present invention concerns semiconductor memory devices with an array of memory cells, each of which is formed by a transistor structure comprising a channel that is located between source and drain and controlled by a gate electrode, and a floating gate electrode that is provided as storage means, like EEPROMs, NOR- and NAND-memories, and further concerns especially adapted methods of production of such devices.

BACKGROUND

NAND-memories are described in the publications of M. Ichige et al., "A novel self-aligned shallow trench isolation cell for 90 nm 4 Gbit NAND Flash EEPROMs" in 2003 Symposium on VLSI Technology Digest of Technical Papers, Session 7B-1; Y.-S. Yim et al., "70 nm NAND Flash Technology with 0.025 µm² Cell Size for 4 Gb Flash Memory" in IEDM 2003, Session 34.1, 2003 IEEE Proceedings p. 819; D.-C. Kim et al., "A 2 Gb NAND Flash Memory with 0.044 µm² Cell Size using 90 nm Flash Technology" in IEDM 2002, Session 37.1, 2002 IEEE Proceedings p. 919; and J.-D. Lee et al., "Data Retention Characteristics of Sub-100 nm NAND Flash Memory Cells" in IEEE Electron Device Letters, vol. 24, no. 12, December 2003, pp. 748–750. Each of these memory cells comprises a transistor body of semiconductor material, which is limited on two opposing sides by electrically insulating material of shallow trench isolations. An upper surface of the transistor body is planar and covered with a dielectric material, which is provided as tunnel oxide. Above the tunnel oxide, the floating gate electrode, comprising electrically conductive material, is arranged, which is surrounded by dielectric material and thus completely electrically insulated. A control gate electrode is arranged above the floating gate electrode and capacitively coupled to the floating gate electrode by an upper coupling dielectric between the electrodes.

The device comprising a planar upper surface of the transistor body has sharp edges confining the channel laterally in a direction that is orthogonal to the longitudinal channel direction running from source to drain. This gives rise to effects of a so-called corner device, the edges being designated as corners according to the usual cross-sections. Because of the sharp curvature of these edges, the electric field strength is much larger at the edges than in the middle part of the channel region. This results in a nonuniform current density along the channel width, which is larger at the transistor edges. Therefore, the devices show no proportionality between the current and the channel width. The transistor performance is also deteriorated by the variation of the field strength across the channel. A further disadvantage of this structure concerns the programming of the floating gate memory cells. A typical NOR device employs channel hot electron injection for programming and Fowler-Nordheim tunneling for erase. In typical NAND applications, both the programming and erasure are performed by Fowler-Nordheim tunneling. The tunnel currents are concentrated at the edges of the channel so that a thick tunnel oxide must be provided in order to achieve the required endurance of the device necessary for a large number of programming cycles.

In order to obviate these problems, floating gate memory cells having modified channel edges have been proposed. This is described, for example, in WO 01/41199 A1 on page 17. A better distribution of the electric field across the channel is obtained by a rounding or smoothing of the edges so that the electric field strength is decreased. As the upper surface of the transistor body deviates from the plane at the rounded edges, the tunnel oxide must be thicker in the marginal regions.

In these devices, the channel current increases approximately proportionally to the width of the channel, but the tunnel current of charge carriers passing across the tunnel oxide is restricted to a middle area of the channel, because the oxide layer in the marginal regions is too thick to be passed by tunneling charge carriers. Therefore, it is not necessary to provide a large general oxide thickness in order to inhibit a premature oxide damage at the channel edges sustaining the main programming current flow, but the lateral restriction of the tunnel area effects the endurance of the device negatively. This disadvantage originates from a higher current density during erase.

On the other hand, the requirements of reliability of the floating gate memory cell necessitates a minimal oxide thickness of typically about 7 to 8 nm, to ensure the desired data retention. Unfortunately, a further scaling down or miniaturization of the memory cell requires the application of a thinner tunnel oxide, as the relation of the thickness of the tunnel oxide and the channel length must be kept constant, in order to cope with the short-channel effects.

SUMMARY OF THE INVENTION

In one aspect, the present invention provides a semiconductor memory device comprising memory cells with floating gate electrodes that is suitable for a sub-100 nm technology.

In another aspect, the present invention provides a semiconductor memory device comprising memory cells with floating gate electrodes that avoids the occurrence of effects of a corner device and reduces short-channel effects, while at the same time ensuring data retention and endurance.

In still a further aspect, the present invention provides a semiconductor memory device comprising memory cells with floating gate electrodes that can be programmed and erased with a tunnel current that is more uniformly distributed across the channel and, if Fowler-Nordheim tunneling is applied, is also more uniformly distributed along the channel.

In still a further aspect, the present invention provides a semiconductor memory device comprising memory cells with floating gate electrodes that are endowed with an enlarged channel width and an improved uniformity of the distribution of the channel current.

In another aspect, the present invention provides especially appropriate production methods for the production of the inventive memory devices applying sub-100 nm technology.

In a further aspect, the present invention provides production methods that are especially appropriate to integrate a memory cell array according to the inventive device with a periphery of an addressing logic circuitry.

The inventive device includes a semiconductor body or substrate with a main semiconductor surface. Shallow trench isolations are arranged parallel to one another at the main surface and run along a first direction. Transistor bodies of semiconductor material are provided for memory cell transistors and are located between the shallow trench isolations.

The device also includes floating gate electrodes that are formed of electrically conductive material and are electrically insulated by dielectric material. Each of the floating gate electrodes is provided as a storage means of a memory cell transistor and is arranged on top of a transistor body. The dielectric material forms a tunnel dielectric between the floating gate electrode and an upper surface of the transistor body. There is also included control gate electrodes formed of electrically conductive material, which are electrically coupled to the floating gate electrodes by a coupling dielectric between the control gate electrode and an upper surface of the coupled floating gate electrode. Rows of control gate electrodes are electrically connected by wordlines. The upper surface of the transistor bodies form a set of points, where a tangential plane with a normal can be defined and where the tunnel dielectric has a thickness value measured along the direction of the normal at the considered point. A primary tunnel area is formed by an area of the upper surface of the transistor bodies in which the thickness deviates at most by twenty percent from a minimum value and has a dimension across one transistor channel which is measured by the length of a curve formed by the intersection of the primary tunnel area of one of the memory cell transistors and a plane which is orthogonal to the first direction. The dimension is larger than a minimal distance between the adjacent shallow trench isolations by at least ten percent.

A preferred embodiment of the device further includes a curve formed by the intersection of the primary tunnel area and a plane which is orthogonal to the first direction, which has a curvature at least in sections at both ends of the curve which are considerably larger than marginal regions at the semiconductor edges, which are rounded in conventional devices each comprise at least one fifth of the length of the curve. At every point of the sections or along the entire curve, the radius of curvature, measuring the curvature in the way of differential calculus and differential geometry, is at most two thirds of the length of the curve.

The inventive method for production of semiconductor memory devices includes a substrate of semiconductor material. A pad oxide is produced on a main surface of the substrate and a pad nitride is deposited on the pad oxide. Trenches are etched through the pad nitride and the pad oxide into the substrate at least in a region, which is provided for a memory cell array, the trenches running parallel to one another and delimiting transistor bodies of semiconductor material. The pad oxide is removed adjacent to the trenches to uncover upper edges of the transistor bodies. At least one oxidation is performed to smooth the edges and to produce a curvature in the upper surfaces of the transistor bodies between the trenches. The trenches are then filled with oxide and the pad nitride is removed to form recesses above the upper surfaces. The recesses are widened to extend into a region of the trenches and to uncover a curved area of the upper surfaces, which are covered with a dielectric material that is provided as tunnel dielectric. The recesses are filled with an electrically conductive material provided for the floating gate electrodes and the upper layers of the oxide in the trenches are removed between the floating gate electrodes. A layer of dielectric material is deposited, which is provided as a coupling dielectric and covers the floating gate electrodes. A layer of electrically conductive material is deposited, which is provided for the control gate electrodes, which forms isolated floating gate electrodes and rows of control gate electrodes that are connected by wordlines.

Further preferred embodiments are provided with a recess in the substrate in the region of the memory cell array, in order to shift the cell transistors to a lower level and thereby improve the compatibility of the lithography steps that are common to the cell array and the periphery containing the address logic circuitry.

These and other features and advantages of the invention will become apparent from the following brief description of the drawings, detailed description and appended claims and drawings.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The floating gate memory cell comprises a channel that is curved along its width. This is accomplished by a curved upper surface of the transistor body that is located between shallow trench isolations. This upper surface is part of the active area. The thickness of the tunnel oxide varies at most slightly so that the lower surface of the floating gate electrode, which is arranged at a small distance above the transistor body, is adapted to the form of the upper surface of the transistor body. The curvatures are preferably concentric, at least in the primary tunnel area, in which the main number of charge carriers pass through the tunnel oxide into the floating gate electrode during the programming process. The channel region encompasses the entire curved surface so that the channel width is comparably large, although the lateral distance between the shallow trench isolations can be kept small, especially at a dimension significantly below the 100 nm scale.

Figure 1:
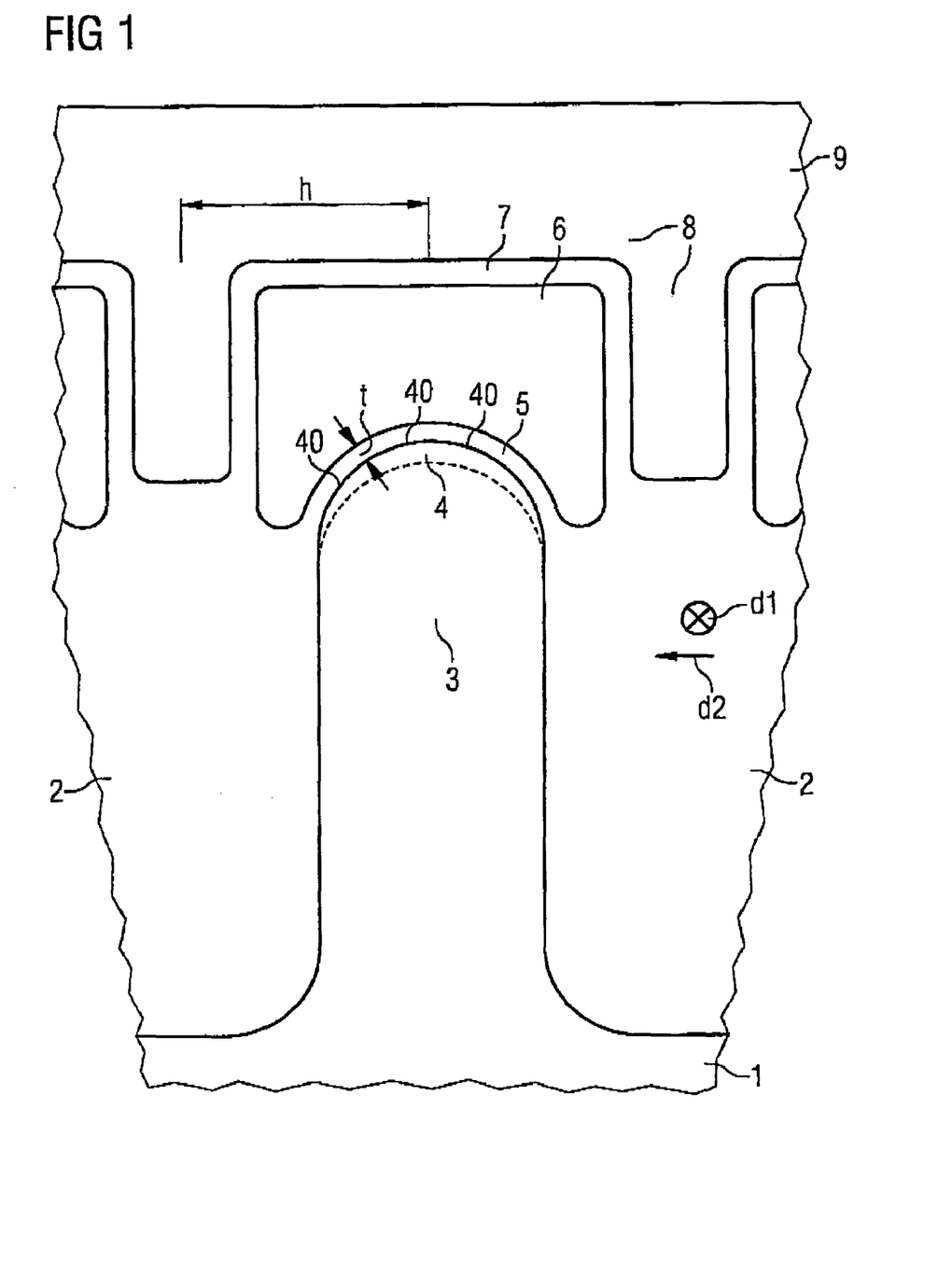
FIG. 1 shows part of a section across an embodiment of the invented memory device.

FIG. 1 shows part of a cross-section through the floating gate memory device. A semiconductor body 1 with a main semiconductor surface is provided with shallow trench isolations 2 arranged parallel to one another at the main surface. The transistor bodies 3 of semiconductor material extend between the shallow trench isolations 2 along a first direction d1 perpendicular to the drawing plane. The transistor bodies are provided for memory cell transistors and comprise the channel regions 4 at an upper surface that comprises a primary tunnel area 40, which is defined below. This upper surface is covered with the tunnel dielectric 5, which separates and electrically insulates the transistor body 3 from the floating gate electrodes 6. Above the floating gate electrodes 6, there are a coupling dielectric 7 and the control gate electrodes 8, which are connected along rows of memory cells by wordlines 9. The dielectric material that insulates the floating gate electrode on all sides can be an oxide. For the purpose of a maximum possible integration of memory cells within the array, the transistor bodies 3 and the shallow trench isolations 2 are arranged in periodic sequence in a second direction d2 across the first direction. A minimal length of periodicity or pitch along the second direction is an important value to measure the degree of integration. The half-pitch h is shown in FIG. 1, measured as the distance from a medium vertical plane in a shallow trench isolation 2 to a medium vertical plane in the transistor body 3; the lateral dimensions of the transistor bodies 3 and the shallow trench isolations 2 may differ. The advantages of a curved channel are especially great in preferred embodiments, in which the half-pitch h is smaller than 100 nm, preferably smaller than 75 nm or even 50 nm.

FIG. 1 clearly shows a feature of a preferred embodiment of the present invention, concerning the geometrical form of the upper surface of the transistor bodies 3. This upper surface is curved across the first direction d1 in order to increase the lateral dimension or width of the channel region 4. The broken line indicates a not strictly defined lower boundary of the channel region 4. When the cell transistor is operating in a mode in which the channel is switched open, charge carriers are moving through the channel region in the direction from source to drain. This current is controlled by an electric potential applied to the control gate electrode 8 and depends on the state of charging of the floating gate electrode 6. During the process of programming, charge carriers, which are electrons in the embodiments considered here, are injected into the floating gate electrode 6, which is electrically insulated from the channel so that the electrons have to pass the tunnel dielectric 5. The tunneling process takes place where the tunnel dielectric is sufficiently thin. The thickness t of the tunnel dielectric is indicated at one point of the upper surface of the transistor body by two arrows that are directed to one another.

In FIG. 1, the curved upper surface is represented by a semicircle so that the actual surface is the half lateral surface of a cylinder. The lower surface of the floating gate electrode 6 is adapted to this form and arranged in concentric fashion so that the two surfaces are spaced apart essentially the same distance all over the primary tunnel area. Instead of the idealized form represented in FIG. 1, the curvature may be more or less irregular. It is the essential feature of the invention that the curvature is not confined to the small edge regions, but extends across a larger area comprising at least sections adjacent to the vertical or steeply sloping sidewalls of the transistor bodies 3.

In any case, the primary tunnel area 40 of an individual cell transistor can be defined as being formed by an area of the upper surface of the corresponding transistor body 3 in which the thickness t of the tunnel oxide 5 deviates at most by 20% from a minimum value, which will usually be provided in a middle area of the surface above the channel region 4. The thickness t of the tunnel oxide 5 can be defined more precisely in the following way, since the curvature of the surface is supposed to be sufficiently smooth. At every point of the upper surface of the transistor bodies, there is a plane that is tangential to the surface and a normal that is perpendicular to the plane. The value of the thickness t at a specified point is measured along the direction of this normal at the point.

The primary tunnel area of an individual cell transistor has a dimension measured across the transistor channel, which is given by the length of a curve that is apparent in FIG. 1 and that is formed by the intersection of the primary tunnel area of the memory cell transistor and a plane, which is orthogonal to the first direction d1 and therefore coplanar to the drawing plane. The designation curve is used here in the mathematical sense of a line, which need not be straight or bent in the same way along its entire length. In the embodiment of FIG. 1, this curve is approximately a semicircle, but may be less curved or may even comprise straight sections, especially in a middle area of the channel region 4.

In the inventive embodiments, the length of this curve is larger than a minimal distance between the sidewalls of adjacent shallow trench isolations by at least 10%. This value exceeds a corresponding dimension of memory cells with rounded edges, since the rounded edges of devices according to the state of the art are covered with a rather thick tunnel oxide, which excludes these areas from the primary tunnel area as defined above. It has previously been explained that the tunneling is inhibited in the regions of the thicker tunnel oxide so that the primary tunnel area as defined above can be regarded as the area that is most important for the tunneling process. The tunnel area is widened by the inventive means of the curved channel so that the channel width is notably larger than it would be if the upper surfaces of the transistor bodies were planar.

Further preferred embodiments comprise a curvature of the curve formed by the intersection of the primary tunnel area and the drawing plane of FIG. 1, which is present at least in sections of the curve that each comprise at least ⅕ of the length of the curve and are located at both lateral margins of the upper surface of the transistor bodies adjacent to the dielectric material of the shallow trench isolations 2. This means that at most 60% of the channel width belonging to the primary tunnel area, measured along the curved surface, is planar, which makes a decisive difference from memory devices according to the state of the art. Preferably, the curved sections at both ends of the curve each comprise at least ⅔ of the length of the curve so that a possible planar region is confined to 20% of the primary tunnel area. Preferred embodiments are provided with channel regions, which are curved all over their width, without a planar area.

The curvature is the change in inclination of a tangent to a curve over unit length of arc. The degree of curvature can be measured in a way well-known in differential geometry, if the curve is twice differentiable and can locally be approximated by a circle. The radius of this circle is the radius of curvature at the point of the curve in which the circle is tangent to the curve. At every point of the curve where the curve is not straight, but is smoothly bent so that the radius of curvature can be defined according to differential calculus, there is a finite radius of curvature, which may be different from point to point. The smaller the radius of curvature, the larger the degree of the curvature, and the more narrowly bent is the curve.

In the preferred embodiment, at every point of the sections of the curve, the radius of curvature is at most ⅔ of the total length of the curve. An upper boundary of the radius of curvature implies that there is a minimal curvature throughout the marginal sections of the primary tunnel area, in which the thickness of the tunnel dielectric does not deviate from the minimal value by more than 10%. In the embodiment with a primary tunnel area comprising exactly one half of the lateral surface of a cylinder, completely covered by a tunnel dielectric of uniform thickness, the quotient of the radius of curvature and the length of the curve is $1/\pi$, approximately 7/22, which is smaller than ⅔. In this case, the sections in which the curvature is present encompass the whole channel width.

The radius of curvature along the curve may instead be restricted to values smaller than the minimal distance between the sidewalls of adjacent shallow trench isolations. This is the diameter of the transistor bodies at an upper level, measured in the direction of the pitch h indicated in FIG. 1. This dimension is about equal to the channel width of a planar device. Preferably, the channel is curved only in one direction so that the channel region is only bent upwards. The control gate electrodes 8 preferably bridge the floating gate electrodes 6 in the way shown in FIG. 1. Preferably, the electrically conductive material of the control gate electrodes 8 is applied so as to form at least lower layers of the wordlines 9.

The curved channel enables a further shrinkability of the memory cells into the region of sub-100 nm technology. At the same time, both the data retention and the endurance of the memory device can be improved. The control of the channel is also improved so that short-channel effects are reduced. The curvature of the channel region enlarges the transistor body that is essential for the programming and erasure processes. The tunnel current density is restricted, and the increased width of the channel and the more uniform current distribution improve the read current. The tunnel dielectric can be applied in uniform thickness to obtain the maximal possible primary tunnel area.

Figure 2:
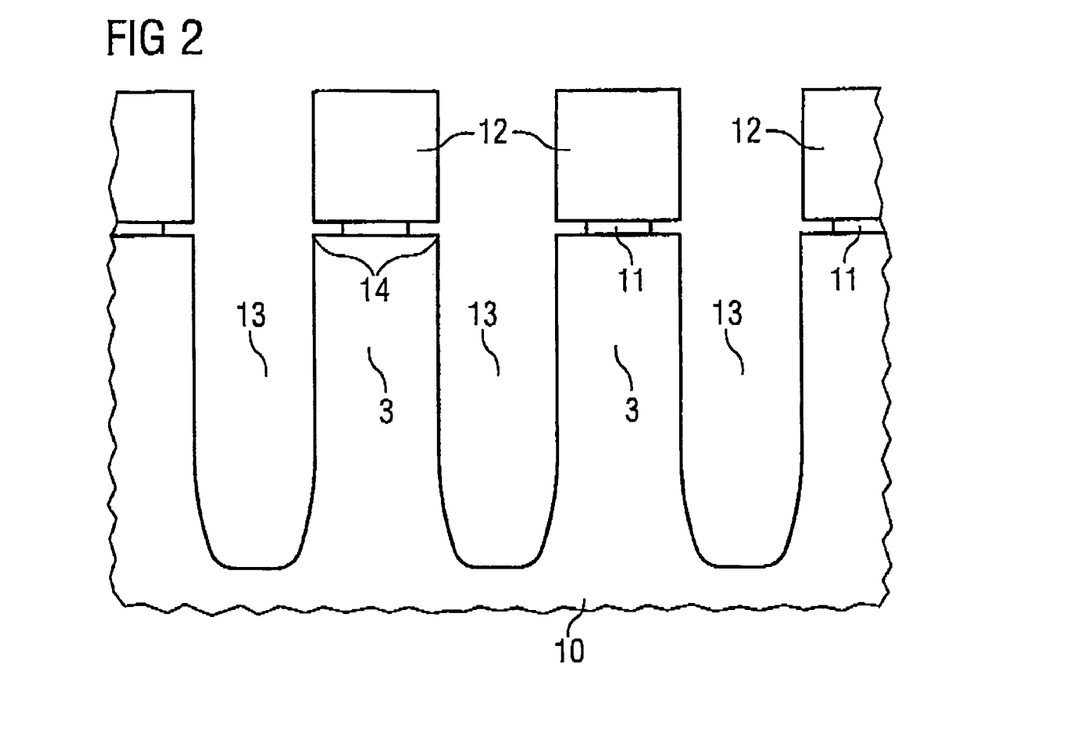
FIG. 2 shows a cross-section of an intermediate product of a preferred production method after the etching of isolation trenches and a pad oxide removal.

The memory device according to FIG. 1 can be produced by a method, which will now be described with respect to FIGS. 2 to 6. A main surface of a semiconductor substrate 10 shown in FIG. 2 is covered with a pad oxide 11 and a pad nitride 12. Then, parallel trenches 13 are etched along the main surface of the substrate 10. The trenches are spaced apart from one another according to the dimension of the transistor bodies 3, thereby separating parts of the substrate 10 that are intended for the transistor bodies 3. The etching step is performed in the usual way using standard lithography, structuring at the same time the pad nitride 12, the pad oxide 11 and the substrate material.

In order to facilitate a subsequent step to prepare the curvature in the upper surface of the transistor bodies 3, it is preferable to etch marginal parts of the pad oxide 11 beneath the remaining parts of the pad nitride 12, as shown in FIG. 2. Due to this pad oxide etch, the upper edges 14 of the semiconductor material are laid bare so that the subsequent oxidizing step will consume part of the semiconductor material and in this manner produce a preliminary rounding of the semiconductor surface. Such an oxidizing step may follow the pad oxide etch in order to cover the semiconductor surface also within the trenches 13 with a thin oxide layer. Instead, a pull-back etch can be performed previously, as shown in FIG. 3, by which the pad nitride layer is laterally reduced according to the structure of the residual parts of the pad oxide 11.

Figure 3:
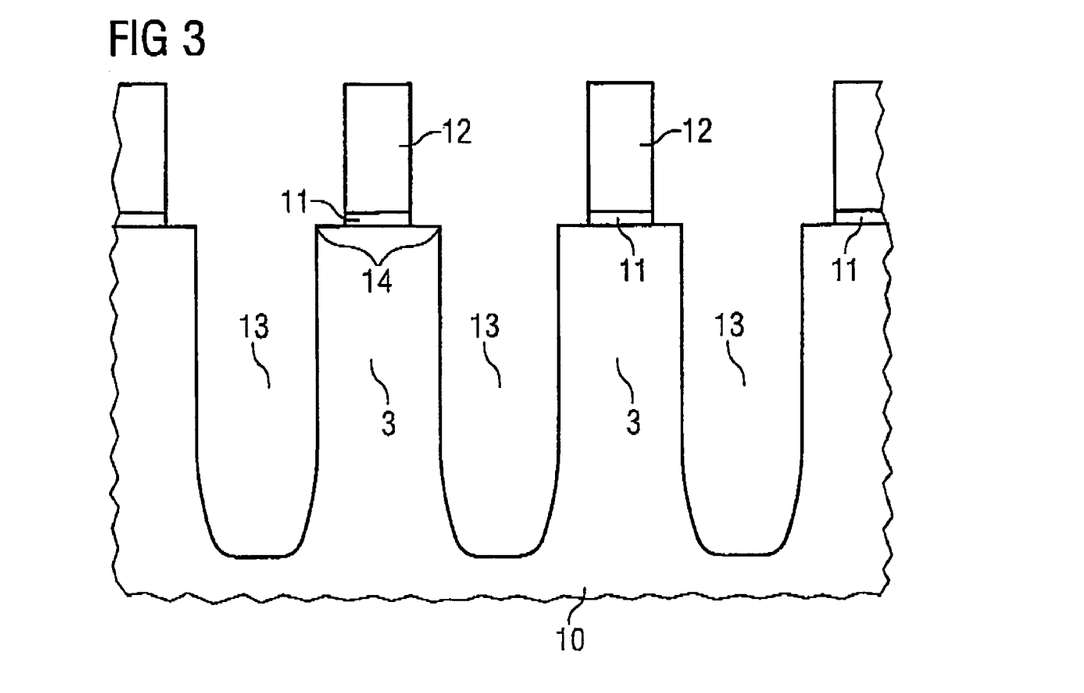
FIG. 3 shows the cross-section according to FIG. 2 after a pull-back of the pad nitride.

The following description of an example of the production method starts from the intermediate product shown in the cross-section of FIG. 3. The upper edges 14 of the semiconductor material of the transistor bodies 3 are now free from the rests of the pad oxide 11 and pad nitride 12. This structure is preferred for the subsequent method step, by which the semiconductor surface is oxidized, thereby consuming an exterior semiconductor layer, which is thicker at the protruding parts, especially at the upper edges. A further optimization of the method can be obtained by the growth of a sacrificial oxide layer, which is subsequently removed by an additional etching step. The process parameters, like temperature, growth rate and time, and the etchant used to remove the oxide layer, can be chosen by the skilled person in the field of semiconductor process technology in an efficient way to achieve the best possible rounding of the edges 14.

Figure 4:
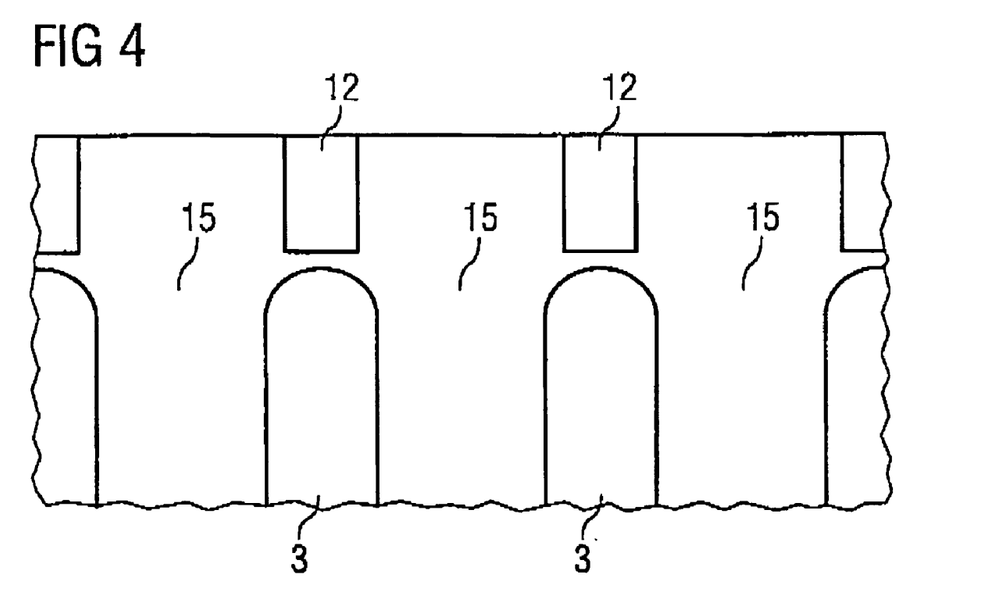
FIG. 4 shows the cross-section according to FIG. 3 after the filling of the trenches.

A high temperature oxide growth is performed to cover the semiconductor surfaces, and the trenches are filled with dielectric material. The trench filling 15 shown in FIG. 4 can be deposited as a high-density plasma oxide. With an alternative method, trenches are filled with spin-on glass and etched back before the high density plasma fill is applied. The upper surface can be planarized by chemical mechanical polishing. FIG. 4 shows the arrangement of the transistor bodies 3, surrounded by oxide, and the remaining parts of the pad nitride 12. The pad nitride 12 can then be etched, selectively to the oxide, to form recesses that are provided for the floating gate electrodes. Preferably at this stage, well implants are produced that are provided for the channel regions and eventually for transistors of an addressing periphery, for example a CMOS logic circuitry. The remaining pad oxide is then removed, preferably by an isotropic wet etch, and the floating gate recesses are widened by a lateral etch attack at the trench fillings.

Figure 5:
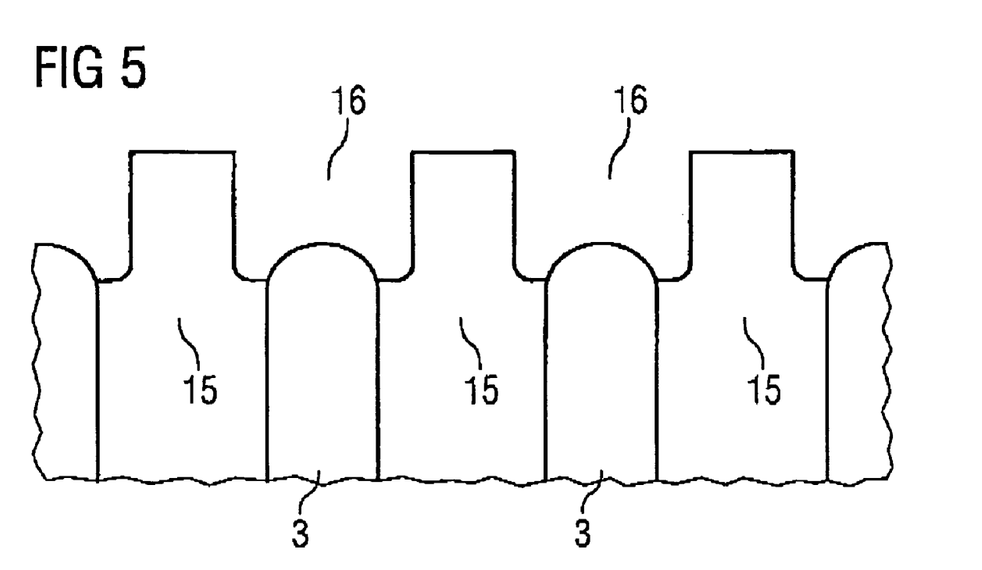
FIG. 5 shows the cross-section of FIG. 4 after the etching of floating gate recesses.

FIG. 5 shows the intermediate product after the etching of the floating gate recesses 16. These recesses 16 run along the transistor bodies 3 between adjacent trench fillings 15. The oxidation step or preferably the sequence of oxidation steps and the etching of the nitride and the oxide have rendered the surface of the semiconductor material convex, presenting a curvature that smoothly and distinctly extends all over the upper surface and essentially surpasses a mere rounding of the edges according to conventional devices.

Figure 6:
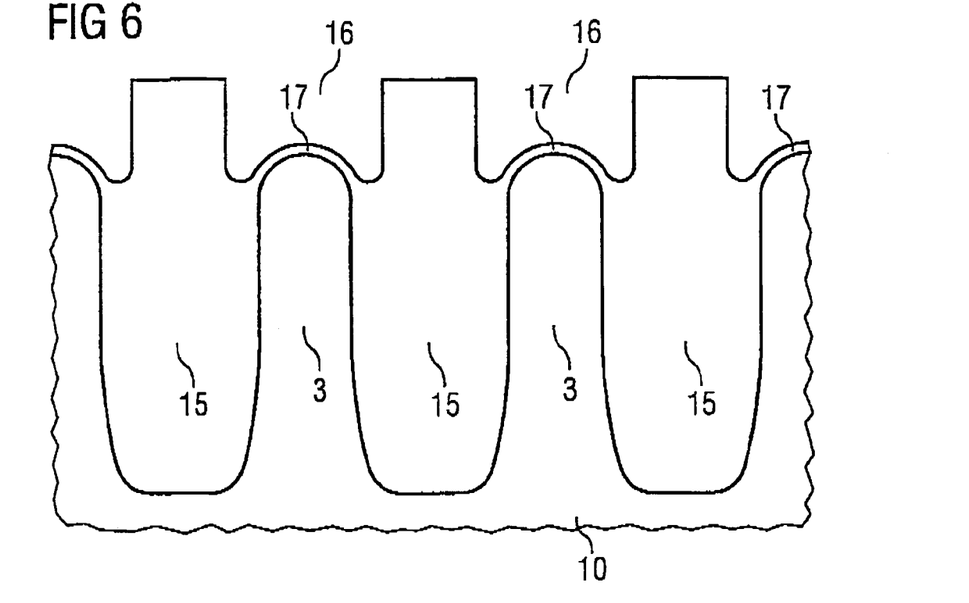
FIG. 6 shows the cross-section according to FIG. 5 after the formation of tunnel oxide.

The curvature of the upper surfaces of the transistor bodies is now prepared in its definite form. As shown in FIG. 6, the tunnel dielectric can be produced by the growth of a tunnel oxide 17 on the upper surfaces of the transistor bodies 3. The floating gate recesses 16 are then filled with electrically conductive material provided for the floating gate electrodes. The upper surface is again planarized by chemical mechanical polishing. Then upper layers of the trench fillings 15 are partly removed by a selective wet etch, in order to produce openings between the regions of the former floating gate recesses that are now filled with the coherent parts of the material provided for the floating gate electrodes. These openings enable the formation of the control gate electrodes also in the regions between adjacent floating gate electrodes. The control gate electrodes can thus be produced to bridge the floating gate electrodes. Before the deposition of the material of the control gate electrodes, a coupling dielectric is grown or deposited on the surfaces of both the floating gate electrodes and the trench fillings.

Figure 7:
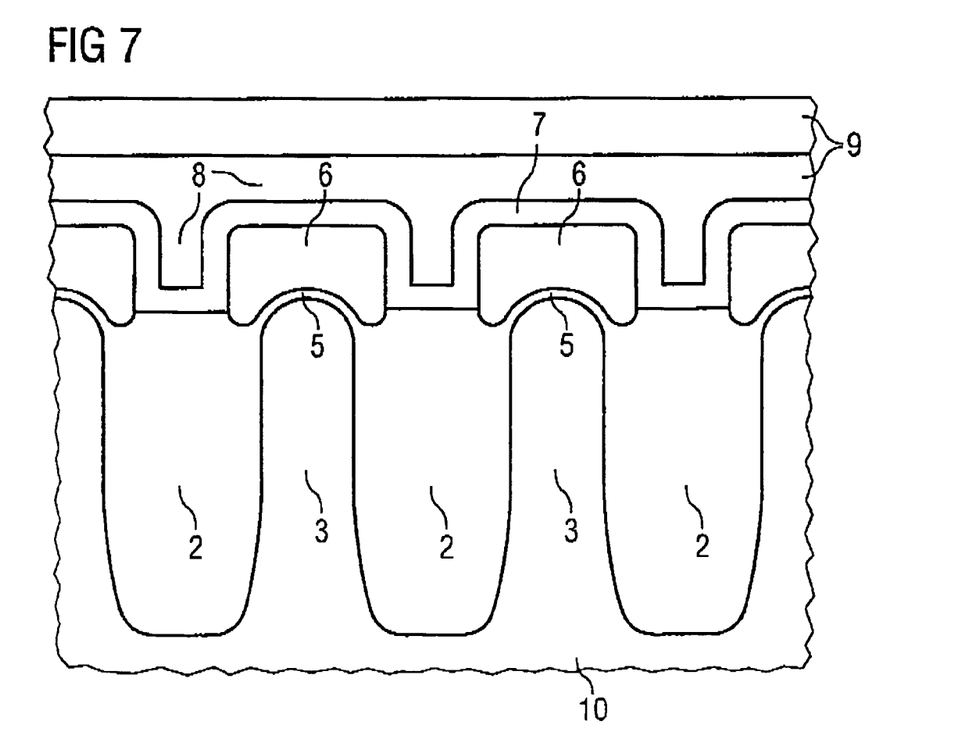
FIG. 7 shows the cross-section according to FIG. 6 after the application of floating gate electrodes, coupling dielectric and wordlines.

FIG. 7 shows the cross-section of the product after the application of the floating gate electrodes 6, the coupling dielectric 7, the control gate electrodes 8 and, preferably, at least one additional layer provided for the wordlines 9. The electrically conductive material forming the control gate electrodes is preferably polysilicon. A lithography step and an etching step, preferably reactive ion etching, are performed to structure the wordlines, the coupling dielectric 7 and the material of the floating gate electrodes 6 to produce the stacks of the wordlines 9. In this step, the floating gate electrodes of individual memory cells are separated from one another. Then, source and drain regions can be implanted self-aligned to the wordline stacks, and intermetal dielectrics, contacts, vias and the usual wirings can be applied by the usual process steps. The spaces between adjacent wordlines are filled with dielectric material, or at least the flanks of the wordline stacks are covered with a dielectric material such as nitride, in order to electrically insulate the floating gate electrodes in the direction to the neighboring wordline stack.

Figure 8:
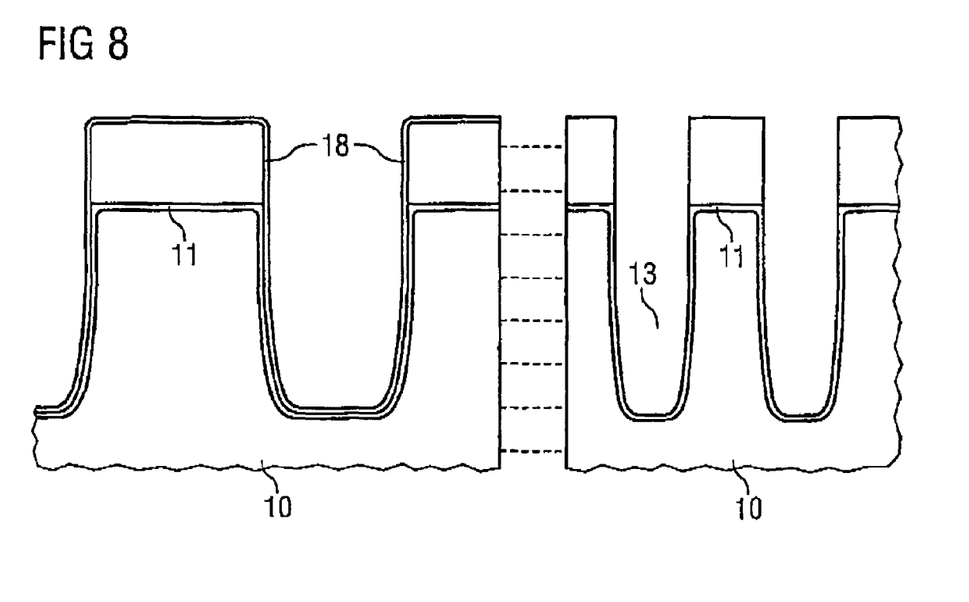
FIG. 8 shows the cross-section according to FIG. 2 after the application of a nitride liner in the periphery.

FIG. 8 shows a cross-section including the region of the periphery comprising the logic circuitry provided to address the memory cells. The cross-section represented in FIG. 8 shows the intermediate product after the formation of the trenches 13 and the subsequent deposition of a thin nitride liner 18. Before the liner is deposited, the pad oxide 11, which is removed on the side and bottom surfaces of the trenches 13, can be substituted with a newly grown oxide layer, covering the semiconductor surface. The oxide layer is formed by a thermal oxidation process, eventually after the application and removal of a sacrificial oxide to improve the surface curvature of the upper regions of the transistor bodies. In any case, the nitride liner 18 is removed in the region of the memory cell array. It is maintained in the region of the periphery in order to cover the devices of the periphery during an oxidation process, which produces a more pronounced curvature of the upper surfaces of the transistor bodies.

Figure 9:
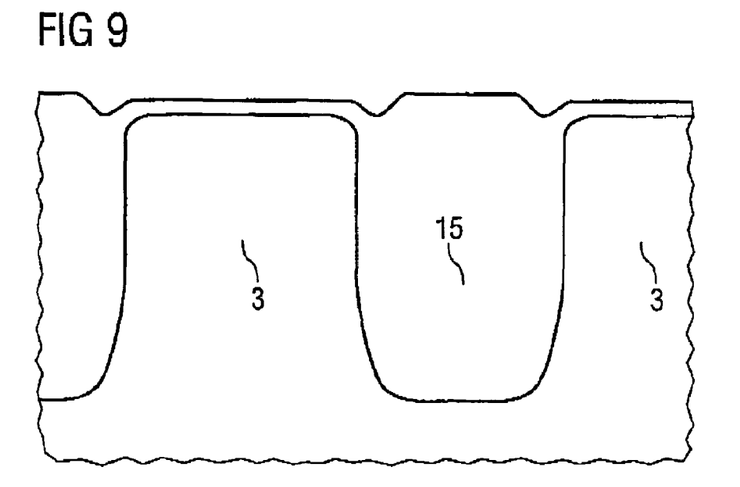
FIG. 9 shows the cross-section of the gate dielectric of the transistors in the periphery.

FIG. 9 shows a cross-section of the periphery after the deposition of a trench filling 15 into the isolating trenches between the transistor bodies 3. For the transistors of the addressing logic circuitry, a standard gate dielectric is formed, preferably an oxide, on the upper surfaces of the transistor bodies. FIG. 9 shows a preferred embodiment in which the lateral upper edges of the semiconductor material are only slightly rounded, and the gate oxide grows thicker in the direction towards the trench isolations, because the transistors in the periphery are preferably structured according to standard devices comprising rounded edges to reduce the effects of a corner device. This conventional corner optimization is preferred for the transistors of the logic circuitry, while the memory cell transistors are provided with the inventive curved channel. The additional application of the nitride liner 18 enables to structure the gate oxide differently in the regions of the memory cell array and the peripheral addressing circuitry.

Figure 10:
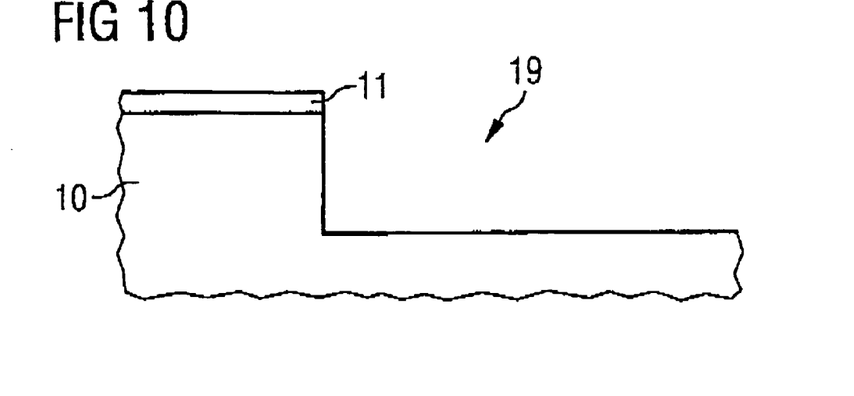
FIG. 10 shows part of a cross-section of an intermediate product of a further embodiment after the formation of a recess in the region of the memory cell array.

An especially preferred embodiment comprises a recess in the semiconductor body in the region of the memory cell array. This embodiment is described with respect to FIGS. 10 to 16. FIG. 10 shows part of a cross-section of the substrate 10 with a first layer of a pad oxide 11 and a recess 19, which is etched in the region of the main surface, which is provided for the memory cell array. The recess 19 is produced with a planar lower surface or bottom and preferably vertical sidewalls.

Figure 11:
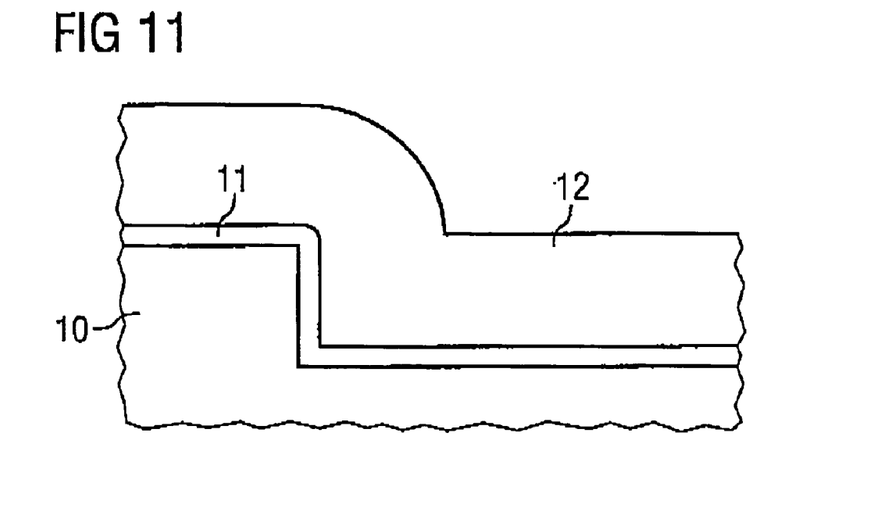
FIG. 11 shows the cross-section according to FIG. 10 after the deposition of pad oxide and pad nitride.

FIG. 11 shows the cross-section according to FIG. 10 after the renewal of the pad oxide 11 on the etched surfaces of the recess and the subsequent deposition of a pad nitride 12. Then, a lithography step takes place to protect the pad nitride in the region provided for the memory cell array within the recess. The pad nitride 12 is removed outside this region, at least on the upper surface, while some nitride can be left at the sidewalls of the recess.

Figure 12:
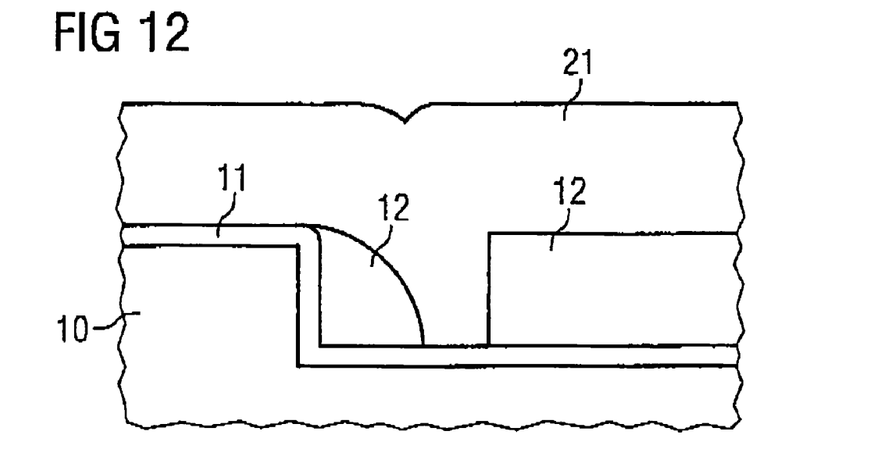
FIG. 12 shows the cross-section according to FIG. 11 after a partial removal of the pad nitride and the deposition of a further nitride layer.

FIG. 12 shows a cross-section according to FIG. 11 after the nitride etch and the deposition of a further nitride layer 21, which is optionally planarized by chemical mechanical polishing. These basic process steps produce a thick nitride layer in the region provided for the memory cell. The pad oxide layer is located within the recess at a lower level than in the peripheral region.

Figure 13:
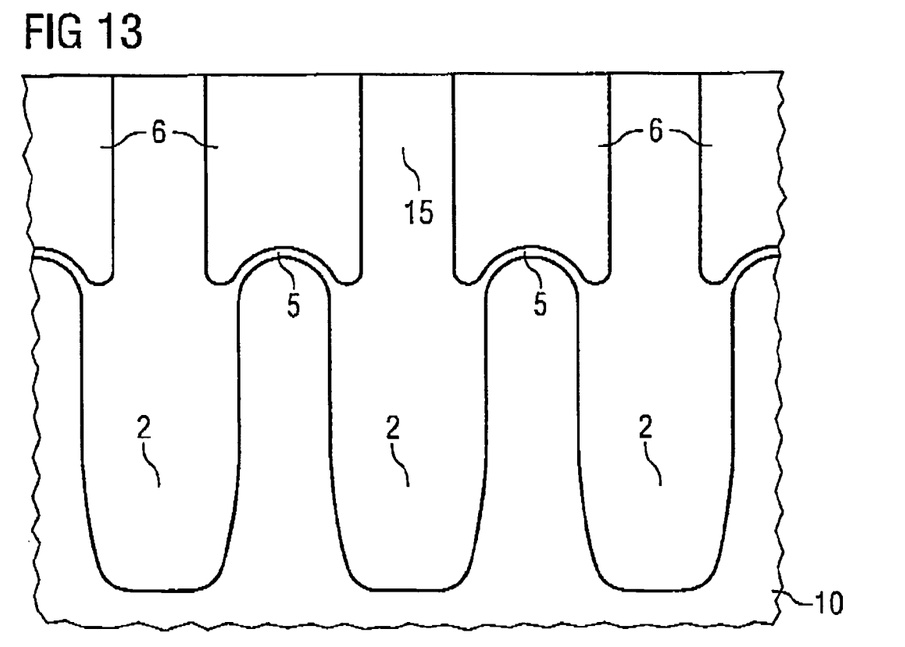
FIG. 13 shows a cross-section of an intermediate product of the second embodiment after the deposition of the floating gate electrodes.

FIG. 13 shows the structure of an intermediate product of this embodiment according to the cross-section of FIG. 6, after the electrically conductive material provided for the floating gate electrodes 6 has been filled into the floating gate recesses. FIG. 13 shows that the vertical dimension of the floating gate electrodes 6 is larger than in the previously described embodiment.

Figure 14:
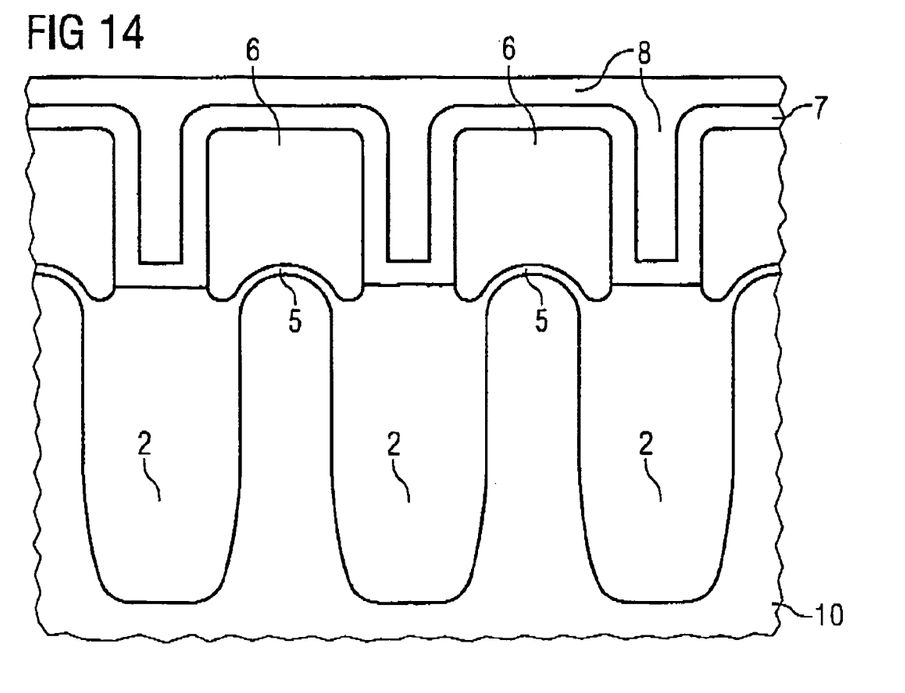
FIG. 14 shows the cross-section according to FIG. 13 after the deposition of the coupling dielectric and the control gate electrodes.

FIG. 14 shows a further intermediate product, after an upper layer of the trench filling has been removed between the floating gate electrodes 6, the coupling dielectric 7 has been applied, and the material provided for the control gate electrodes 8 has been deposited. A comparison between the cross-sections of FIG. 7 and FIG. 14 shows that the recess renders a structure of floating gate electrodes 6 with larger vertical dimension. If the described recess is provided for the memory cell array, an intermediate product can be obtained which has an upper surface that is planar at least in the area of the memory cell array including its borders, and preferably all over the device. This improves the lithography step, especially if it is applied common to the memory cells and to the periphery, because a high degree of uniformity of the resist thickness can be achieved. The larger aspect ratio, that is, the quotient of the vertical dimension and the lateral dimension, of the floating gate electrodes improves the capacitive coupling to the control gate electrodes.

Figure 15:
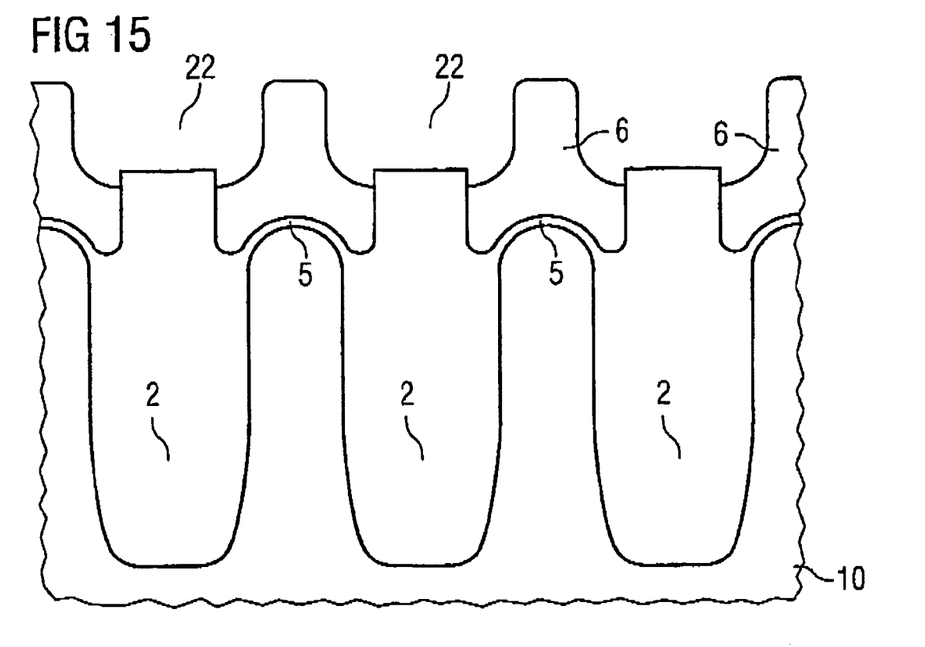
FIG. 15 shows the cross-section according to FIG. 13 after the optional etching of control gate recesses.
Figure 16:
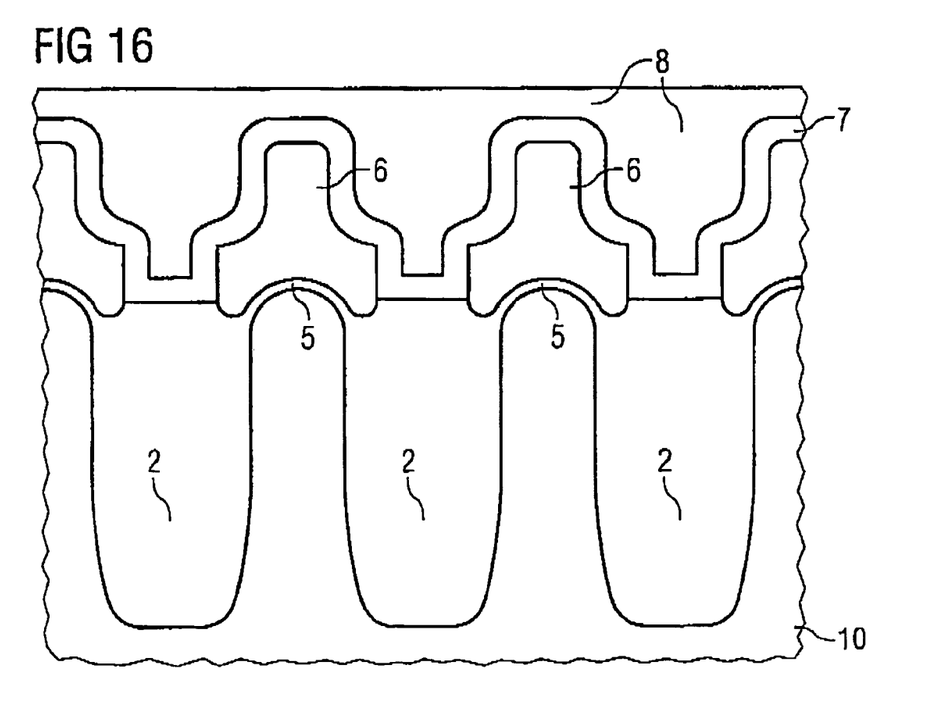
FIG. 16 shows the cross-section according to FIG. 15 after the deposition of the coupling dielectric and the control gate electrodes.

FIG. 15 shows a variant of the embodiment according to FIGS. 13 and 14, in which the openings provided for the control gate electrodes are laterally widened to form control gate recesses 22 which partially overlap the inferior parts of the floating gate electrodes 6. This leads to the structure shown in FIG. 16, in which the upper lateral parts of the control gate electrodes 8 located between the tapered upper sections of the floating gate electrodes 6 are broader than the parts at the bottom.

It is an advantage of the curved channel to improve the gate-to-channel coupling of the transistor, especially in the embodiment comprising a concentric arrangement of the capacitor plates, preferably in cylindrical shape. In concentric arrangements of capacitor plates, the electric field strength increases proportionally to the reciprocal radius.

Figure 17:
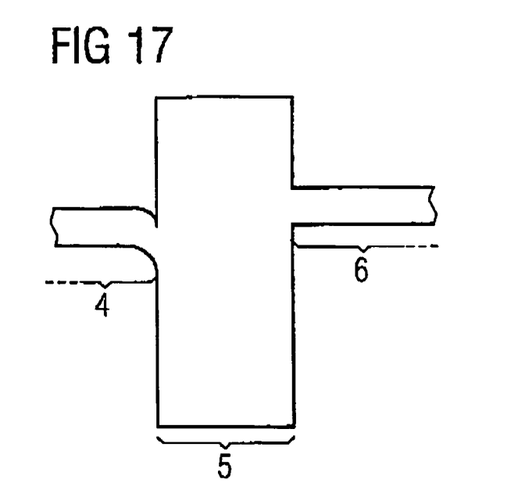
FIG. 17 shows a diagram of the energy bands in the non-operative state of an inventive memory cell.
Figure 18:
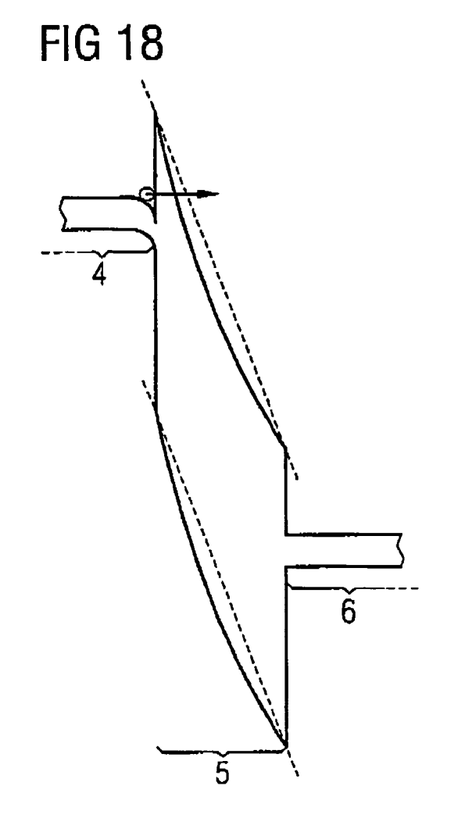
FIG. 18 shows the energy band diagram during programming.
Figure 19:
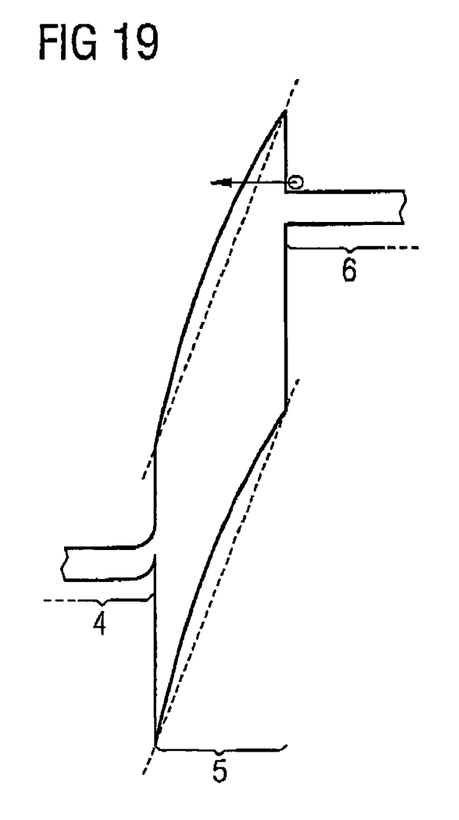
FIG. 19 shows the energy band diagram during erasure.

This means that the dependency of the energy bands on the position, when a certain electric potential is applied, does not vary linearly as in parallel capacitors, but is an In function of the radius. The corresponding energy band diagrams are shown in FIGS. 17 to 19 in principle. The left side of the diagram represents the channel region 4, the middle part represents the region of the tunnel dielectric 5, and the right side represents the region of the floating gate electrode 6. FIG. 17 shows the energy band diagram in the steady state of not addressed memory cells. FIG. 18 shows the energy band diagram for the programming process. During the programming process, when a positive voltage is applied to the control gate, the conduction band and the valence band of the tunnel oxide are not limited by straight lines, as shown by the broken lines in FIG. 18, but deviate below the straight lines. This property of the energy band in the tunnel oxide improves the programming voltage and programming velocity, whereas the erasure tends to become slower. The reason for the latter is that, as shown in FIG. 19, the energy band limits deviate upwards from the straight lines. A slow erasure, however, is tolerable, while the storage of data is desired to be feasible as fast as possible.

Although the present invention and its advantages have been described in detail, it should be understood that various changes, substitutions and alterations can be made herein without departing from the spirit and scope of the invention as defined by the appended claims.

What is claimed is:

1. A semiconductor memory device comprising:
   a semiconductor body with a main semiconductor surface;
   shallow trench isolations arranged parallel to one another at said surface and running along a first direction;
   transistor bodies of semiconductor material provided for memory cell transistors and located at said main semiconductor surface between said shallow trench isolations;
   floating gate electrodes formed of electrically conductive material and electrically insulated by dielectric material, each of said floating gate electrodes being provided as a storage node of one of said memory cell transistors;
   each of said floating gate electrodes being arranged on top of one of said transistor bodies, said dielectric material forming a tunnel dielectric between the floating gate electrode and an upper surface of said transistor body;
   control gate electrodes formed of electrically conductive material, each control gate electrode capacitively coupled to a corresponding one of said floating gate electrodes via a coupling dielectric between the control gate electrode and an upper surface of the coupled floating gate electrode;
   wordlines electrically connecting said control gate electrodes;
   said upper surface of said transistor body forming a set of points, where a tangential plane to said surface exists, which has a normal directed perpendicularly to said plane;
   said coupling dielectric having a thickness at said points of said upper surface of said transistor body, a value of said thickness being measured along the direction of said normal at that point;
   a primary tunnel area being formed by an area of said upper surface of said transistor body in which said thickness deviates at most by twenty percent from a minimum value of said thickness;
   said primary tunnel area having a dimension across one transistor channel which is measured byte length of a curve formed byte intersection of said primary tunnel area of one of said memory cell transistors and a plane which is orthogonal to the first direction; and
   said dimension being larger than a minimal distance between adjacent shallow trench isolations by at least ten percent.

2. The semiconductor memory device according to claim 1 wherein:
   said curve formed by the intersection of said primary tunnel area and a plane which is orthogonal to the first direction having a curvature at least in sections at both ends of said curve;
   said sections each comprising at least one fifth of the length of said curve;
   said curvature comprising a radius of curvature; and
   at every point of said sections, said radius of curvature being at most two thirds of the length of said curve.

3. The semiconductor memory device according to claim 2 wherein said sections at both ends of said curve each comprise at least two fifths of the length of said curve.

4. The semiconductor memory device according to claim 1 wherein:
   said curve formed by the intersection of said primary tunnel area and a plane which is orthogonal to the first direction having a curvature comprising a radius of curvature; and
   at every point of said curve, said radius of curvature being at most two thirds of the length of said curve.

5. The semiconductor memory device according to claim 1 wherein:
   said curve formed by the intersection of said primary tunnel area and a plane which is orthogonal to the first direction having a curvature comprising a radius of curvature; and
   at every point of said curve, said radius of curvature being at most equal to a minimal distance between adjacent shallow trench isolations.

6. The semiconductor memory device according to claim 1 further comprising:
   a periodical sequence of said shallow trench isolations and said transistor bodies in a second direction that is orthogonal to the first direction;
   a minimal length of periodicity or pitch along the second direction; and
   the length of said curve formed by the intersection of said primary tunnel area and a plane which is orthogonal to the first direction being larger than one half of said pitch.

7. The semiconductor memory device according to claim 1 further comprising:
   a periodical sequence of said shallow trench isolations and said transistor bodies in a second direction that is orthogonal to the first direction;
   a minimal length of periodicity or pitch along the second direction;
   said curve formed by the intersection of said primary tunnel area and a plane which is orthogonal to the first direction having a curvature at least in sections at both ends of said curve;
   said sections each comprising at least one fifth of the length of said curve;
   said curvature comprising a radius of curvature; and
   at every point of said sections, said radius curvature being at most one half of said pitch.

8. The semiconductor memory device according to claim 1 further comprising:

a periodical sequence of said shallow trench isolations and said transistor bodies in a second direction tat is orthogonal to the first direction;

a minimal length of periodicity or pitch along the second direction;

said curve formed by the intersection of said primary tunnel area and a plane which is orthogonal to the first direction having a curvature comprising a radius of curvature; and at every point of said curve, said radius of curvature being at most one half of said pitch.

9. The semiconductor memory device according to claim 6 wherein said pitch is less than 200 nm.

10. The semiconductor memory device according to claim 9 wherein said pitch is less than 150 nm.

11. The semiconductor memory device according to claim 10 wherein said pitch is less than 100 nm.

12. The semiconductor memory device according to claim 1 wherein said primary tunnel area forms part of a cylindrical surface.

13. The semiconductor memory device according to claim 12 wherein said upper surface of said transistor body forms half of a lateral cylindrical surface.

14. The semiconductor memory device according to claim 1 wherein said thickness of said tunnel dielectric above said primary tunnel area is at most 10 nm.

15. A semiconductor memory device comprising:

a semiconductor body with a main semiconductor surface comprising a region provided for a memory cell array;

shallow trench isolations arranged parallel to one another at said surface at least in said region;

transistor bodies of semiconductor material located at said surface in portions of said region between said shallow trench isolations;

said transistor bodies being provided for memory cell transistors and having a non-planar upper surface extending down from a high level that is substantially the same as said main semiconductor surface outside said region provided for said memory cell array to a level lower than said main semiconductor surface;

floating gate electrodes and control gate electrodes of electrically conductive material being arranged above said upper surface of said transistor bodies each floating gate electrode being provided as a storage node of a memory cell transistor and being electrically insulated from said semiconductor material by a tunnel dielectric, wherein said control gate electrodes are electrically insulated from said floating gate electrodes by a coupling dielectric; and a primary tunnel area being formed by an area of said upper surface of said transistor body in which said tunnel dielectric has thickness which deviates at most by twenty percent from a minimum value of said thickness;

said primary tunnel area having a dimension across on transistor channel which is measured by the length of a curve formed by the intersection of said primary tunnel area of one of said memory cell transistors and a plane which is orthogonal to a longitudinal extension of said shallow trench isolations; and said dimension being larger than a minimal distance between adjacent shallow trench isolations by at least ten percent.

16. The semiconductor memory device according to claim 15 wherein:

said curve has a curvature at least in sections at both ends of said curve;

said sections each comprise at least one fifth of the length of said curve;

said curvature comprises a radius of curvature; and at every point of said sections, said radius of curvature is at most two thirds of the length of said curve.

17. The semiconductor memory device according to claim 16 wherein said sections at both ends of said curve each comprise at least two fifths of the length of said curve.

18. The semiconductor memory device according to claim 15 wherein:

said curve has a curvature comprising a radius of curvature; and at every point of said curve, said radius of curvature is at most two thirds of the length of said curve.

19. The semiconductor memory device according to claim 15 wherein:

said curve has a curvature comprising a radius of curvature; and at every point of said curve, said radius of curvature is at most a minimal distance between adjacent shallow trench isolations.

20. The semiconductor memory device according to claim 15 wherein said shallow trench isolations and said transistor bodies are arranged in periodic sequence that has a minimal length of periodicity or pitch, and where the length of said curve is larger than one half of said pitch.

21. The semiconductor memory device according to claim 15 wherein:

said shallow trench isolations and said transistor bodies are arranged in a periodic sequence that has a minimal length of periodicity or pitch;

said curve has a curvature at least in sections at both ends of said curve;

said sections each comprises at least one fifth of the length of said curve;

said curvature comprises a radius of curvature; and at every point of said sections, said radius of curvature is at most one half of said pitch.

22. The semiconductor memory device according to claim 15 wherein:

said shallow trench isolations and said transistor bodies are arranged in a periodic sequence that has a minimal length of periodicity or pitch;

said curve has a curvature comprising a radius of curvature; and at every point of said curve, said radius of curvature is at most one half of said pitch.

23. The semiconductor memory device according to claim 15 wherein said primary tunnel area forms part of a cylindrical surface.

24. The semiconductor memory device according to claim 23 wherein said upper surface of said transistor body forms half of a lateral cylindrical surface.

* * * * *

UNITED STATES PATENT AND TRADEMARK OFFICE
CERTIFICATE OF CORRECTION

PATENT NO.       : 7,250,651 B2                               Page 1 of 1
APPLICATION NO.  : 10/921766
DATED            : July 31, 2007
INVENTOR(S)      : Küsters et al.

It is certified that error appears in the above-identified patent and that said Letters Patent is hereby corrected as shown below:

In Col. 11, line 67, delete "byte" and insert --by the--.
In Col. 12, line 1, delete "byte" and insert --by the--.
In Col. 13, line 2, delete "tat" and insert --that--.
In Col. 13, line 43, delete "bodies" and insert --bodies,--.

Signed and Sealed this

Twenty-seventh Day of November, 2007

JON W. DUDAS
*Director of the United States Patent and Trademark Office*